United States Patent
Baldi et al.

(10) Patent No.: US 9,048,410 B2
(45) Date of Patent: Jun. 2, 2015

(54) MEMORY DEVICES COMPRISING MAGNETIC TRACKS INDIVIDUALLY COMPRISING A PLURALITY OF MAGNETIC DOMAINS HAVING DOMAIN WALLS AND METHODS OF FORMING A MEMORY DEVICE COMPRISING MAGNETIC TRACKS INDIVIDUALLY COMPRISING A PLURALITY OF MAGNETIC DOMAINS HAVING DOMAIN WALLS

(71) Applicant: Micron Technology, Inc., Boise, ID (US)

(72) Inventors: Livio Baldi, Agrate Brianza (IT); Marcello Mariani, Milan (IT)

(73) Assignee: Micron Technology, Inc., Boise, ID (US)

( * ) Notice: Subject to any disclaimer, the term of this patent is extended or adjusted under 35 U.S.C. 154(b) by 41 days.

(21) Appl. No.: 13/906,857

(22) Filed: May 31, 2013

(65) Prior Publication Data

US 2014/0353781 A1 Dec. 4, 2014

(51) Int. Cl.
*H01L 43/12* (2006.01)
*H01L 43/02* (2006.01)

(52) U.S. Cl.
CPC ............... *H01L 43/02* (2013.01); *H01L 43/12* (2013.01)

(58) Field of Classification Search
CPC .............................. H01L 43/02; H01L 43/12
USPC ...................... 438/3, 692; 257/421
See application file for complete search history.

(56) References Cited

U.S. PATENT DOCUMENTS

| | | | | |
|---|---|---|---|---|
| 3,611,328 | A | * | 10/1971 | Spain ............................. 365/173 |
| 4,702,792 | A | * | 10/1987 | Chow et al. ................... 438/692 |
| 5,050,122 | A | | 9/1991 | Maruyama et al. |
| 5,084,407 | A | * | 1/1992 | Boland et al. ................. 438/400 |
| 5,084,419 | A | * | 1/1992 | Sakao ............................ 438/400 |
| 5,244,534 | A | * | 9/1993 | Yu et al. ........................ 438/672 |

(Continued)

FOREIGN PATENT DOCUMENTS

| | | |
|---|---|---|
| CN | 200710303545 | 10/2007 |
| EP | 1349172 | 10/2003 |

(Continued)

OTHER PUBLICATIONS

Devarajan, et al.; Die-on-Wafer and Wafer-Level Three-Dimensional (3D) Integration of Heterogeneous IC Technologies for RF-Microwave-Millimeter Applications; 2004 MRS Fall Meeting; pp. G6.8.1-G6.8.6.

(Continued)

*Primary Examiner* — Mary Wilczewski
(74) *Attorney, Agent, or Firm* — Wells St. John, P.S.

(57) ABSTRACT

A method of forming a memory device having magnetic tracks individually comprising a plurality of magnetic domains having domain walls, includes forming an elevationally outer substrate material of uniform chemical composition. The uniform composition material is partially etched into to form alternating regions of elevational depressions and elevational protrusions in the uniform composition material. A plurality of magnetic tracks is formed over and which angle relative to the alternating regions. Interfaces of immediately adjacent of the regions individually form a domain wall pinning site in individual of the magnetic tracks. Other methods, including memory devices independent of method, are disclosed.

16 Claims, 10 Drawing Sheets

(56) References Cited

U.S. PATENT DOCUMENTS

| | | | |
|---|---|---|---|
| 5,429,711 A * | 7/1995 | Watanabe et al. | 438/464 |
| 5,672,400 A | 9/1997 | Hansen et al. | |
| 5,858,854 A * | 1/1999 | Tsai et al. | 438/401 |
| 5,880,003 A * | 3/1999 | Hayashi | 438/405 |
| 5,883,762 A * | 3/1999 | Calhoun et al. | 205/119 |
| 6,020,263 A * | 2/2000 | Shih et al. | 438/692 |
| 6,025,618 A | 2/2000 | Chen | |
| 6,042,998 A | 3/2000 | Brueck et al. | |
| 6,051,477 A * | 4/2000 | Nam | 438/404 |
| 6,114,215 A * | 9/2000 | Osugi et al. | 438/401 |
| 6,124,634 A | 9/2000 | Akram et al. | |
| 6,218,731 B1 | 4/2001 | Huang et al. | |
| 6,254,966 B1 * | 7/2001 | Kondo | 428/156 |
| 6,391,658 B1 | 5/2002 | Gates et al. | |
| 6,509,270 B1 * | 1/2003 | Held | 438/691 |
| 6,583,502 B2 | 6/2003 | Lee et al. | |
| 6,693,002 B2 | 2/2004 | Nakamura et al. | |
| 6,727,537 B2 | 4/2004 | Wunderlich | |
| 6,780,771 B1 * | 8/2004 | Jayatilaka et al. | 438/690 |
| 6,781,871 B2 | 8/2004 | Park et al. | |
| 6,787,798 B1 | 9/2004 | Andrews et al. | |
| 6,787,917 B2 | 9/2004 | Lee et al. | |
| 6,834,005 B1 | 12/2004 | Parkin | |
| 6,887,769 B2 | 5/2005 | Kellar et al. | |
| 6,898,132 B2 | 5/2005 | Parkin | |
| 6,906,949 B1 | 6/2005 | Nakamura et al. | |
| 6,914,807 B2 | 7/2005 | Nakamura et al. | |
| 6,920,062 B2 | 7/2005 | Parkin | |
| 6,970,379 B2 * | 11/2005 | Parkin | 365/173 |
| 7,009,874 B2 | 3/2006 | Deak | |
| 7,031,178 B2 | 4/2006 | Parkin | |
| 7,037,804 B2 | 5/2006 | Kellar et al. | |
| 7,042,762 B2 | 5/2006 | Nakamura et al. | |
| 7,057,249 B2 | 6/2006 | Anthony et al. | |
| 7,236,386 B2 | 6/2007 | Parkin | |
| 7,242,604 B2 | 7/2007 | Klaeui et al. | |
| 7,315,470 B2 * | 1/2008 | Parkin | 365/173 |
| 7,332,781 B2 | 2/2008 | Nozieres et al. | |
| 7,352,178 B2 | 4/2008 | Pullini et al. | |
| 7,439,082 B2 | 10/2008 | Rinerson et al. | |
| 7,474,004 B2 | 1/2009 | Leedy | |
| 7,514,271 B2 | 4/2009 | Gaidis et al. | |
| 7,551,469 B1 | 6/2009 | Parkin | |
| 7,570,526 B2 | 8/2009 | Han | |
| 7,622,377 B2 | 11/2009 | Lee et al. | |
| 7,626,844 B1 | 12/2009 | Moriya et al. | |
| 7,635,617 B2 | 12/2009 | Yamazaki | |
| 7,674,686 B2 | 3/2010 | Gupta | |
| 7,710,770 B2 | 5/2010 | Cowburn et al. | |
| 7,772,632 B2 | 8/2010 | Haller et al. | |
| 7,826,257 B2 | 11/2010 | Saitoh et al. | |
| 7,869,266 B2 | 1/2011 | Ranjan et al. | |
| 7,872,896 B2 | 1/2011 | Hung | |
| 7,889,533 B2 | 2/2011 | Hwang et al. | |
| 7,902,579 B2 | 3/2011 | Lim et al. | |
| 7,969,762 B2 | 6/2011 | Cros et al. | |
| 7,969,774 B2 | 6/2011 | Meade et al. | |
| 8,009,453 B2 | 8/2011 | Gaidis et al. | |
| 8,023,305 B2 | 9/2011 | Gaidis et al. | |
| 8,102,691 B2 | 1/2012 | Xi et al. | |
| 8,120,082 B2 | 2/2012 | Park | |
| 8,125,814 B2 | 2/2012 | Tsai | |
| 8,130,531 B2 | 3/2012 | Tsai et al. | |
| 8,164,947 B2 | 4/2012 | Ranjan et al. | |
| 8,174,873 B2 | 5/2012 | Suzuki et al. | |
| 8,270,197 B2 | 9/2012 | Lee | |
| 8,574,730 B2 * | 11/2013 | Cho et al. | 428/832 |
| 2005/0078511 A1 * | 4/2005 | Parkin | 365/171 |
| 2005/0091440 A1 | 4/2005 | Isa et al. | |
| 2006/0028866 A1 * | 2/2006 | Parkin | 365/173 |
| 2008/0243972 A1 | 10/2008 | Gaidis et al. | |
| 2008/0283995 A1 | 11/2008 | Bucki et al. | |
| 2008/0288720 A1 | 11/2008 | Atwal et al. | |
| 2009/0073859 A1 * | 3/2009 | Cho et al. | 369/135 |
| 2009/0239100 A1 * | 9/2009 | Watanabe | 428/828 |
| 2010/0232056 A1 * | 9/2010 | Fukushima et al. | 360/77.02 |
| 2011/0233774 A1 | 9/2011 | Meade et al. | |
| 2012/0026816 A1 | 2/2012 | Roohparvar | |
| 2013/0005053 A1 | 1/2013 | Joseph et al. | |
| 2013/0039129 A1 | 2/2013 | Rajke et al. | |
| 2014/0353781 A1 * | 12/2014 | Baldi et al. | 257/421 |

FOREIGN PATENT DOCUMENTS

| | | |
|---|---|---|
| EP | 1349184 | 10/2003 |
| EP | 1430484 | 6/2004 |
| JP | 2005-135453 | 5/2005 |
| JP | 2007150208 | 6/2007 |
| KR | 2006-0013476 | 2/2006 |
| WO | 2006/064022 | 6/2006 |
| WO | WO PCT/US2010/026235 | 9/2010 |
| WO | WO PCT/US2010/026235 | 9/2011 |

OTHER PUBLICATIONS

Dieny, Bernard; Overview on MRAM—STT RAM R&D; May 2012; 8 pp.

Home page—FP7—Research—Europa; http://ec.europa.eu/researchffp7/index_en.cfm; at least as early as Jul. 2010; 2 pp.

K. Greene; 10 Breakthrough Technologies; www2.technologyreview.com/article/412189/tr10-racetrack-memory; Mar.-Apr. 2009; 2 pp.

Magnetic Nanowires for High Density Non Volatile Memories; UNIVERSITE PARIS-SUD; Administrative Contact: Nicolas Lecompte; Oct. 2010; 3 pp.

Overview on MRAM-STT RAM R&D; spintec; May 2012; 8 pp.

R. Mantovan et al.; Thin Solid Films; 2013; http://dx.doi.org/10.1016/j.tsf.2012.12.111; 4 pp.

Thomas et al.; Dynamics of Magnetic Domain Walls Under Their Own Inertia; Science, vol. 330; www.sciencemag.org; Dec. 24, 2010; pp. 1810-1813.

Thomas et al.; Racetrack Memory: a high-performance, low-cost, non-volatile memory based on magnetic domain walls; IEEE 2011; pp. 24.2.1-24.2.4.

Zhao et al.; Magnetic Domain-Wall Racetrack Memory for "Universal" Storage; At least as early as Jan. 1, 2013; 5 pp.

* cited by examiner

MEMORY DEVICES COMPRISING MAGNETIC TRACKS INDIVIDUALLY COMPRISING A PLURALITY OF MAGNETIC DOMAINS HAVING DOMAIN WALLS AND METHODS OF FORMING A MEMORY DEVICE COMPRISING MAGNETIC TRACKS INDIVIDUALLY COMPRISING A PLURALITY OF MAGNETIC DOMAINS HAVING DOMAIN WALLS

STATEMENT

Research leading to this disclosure included funding from the European Union's Framework Programme (FP/2007-2013) under grant agreement 257707.

TECHNICAL FIELD

Embodiments disclosed herein pertain to memory devices comprising magnetic tracks individually comprising a plurality of magnetic domains having domain walls, and to methods of forming a memory device comprising magnetic tracks individually comprising a plurality of magnetic domains having domain walls.

BACKGROUND

Data storage devices are divided, for the most part, into volatile data storing devices that lose all recorded data when power is turned off and non-volatile data storing devices that keep data even when the power is turned off. Non-volatile data storing devices include hard disk drives (HDDs) and non-volatile random access memory (RAM). The HDDs include a read and write head and a rotating data recording medium and can store data of 100 Gb or more. However, a device that has rotating parts like the HDD wears over time and, thus, there is a high possibility of operational failure, thereby reducing reliability and life.

Research and development continues with respect to non-volatile data storage devices which do not have physically moving parts and can be fabricated of high density. One such device employs movement of a magnetic domain and magnetic domain walls within a magnetic substance, and is presently commonly referred to as "racetrack magnetic memory". Regardless, a magnetic domain in such devices constitutes a minute magnetic region of ferromagnetic material, and has a common magnetic moment throughout the domain. The size and magnetization direction of a magnetic domain can be appropriately controlled by the shape, size, and properties of a magnetic substance and external energy. A magnetic domain wall is a boundary portion between immediately adjacent magnetic domains. Magnetic domains and their associated walls can be moved by an external magnetic field or by a current applied to a magnetic substance. Conceptually, a sequence of magnetic domains can be stored along a thin, narrow strip, and can be collectively moved along the strip. The magnetic domains and walls in the individual strips are caused to be moved past read and/or write heads to read the present state of the magnetization direction of the domains, and/or to change such with the write head.

Ideally, to have a predictable reading and writing of the respective domains, the domains should be placed at regular intervals along the strip and move in a discrete regular manner. Accordingly, a critical issue is to control the position of the magnetic domains and to move them in a controlled way. Further, the magnetic domains should not move or wander between read and write operations, for example due to thermal effects. Accordingly, pinning mechanisms have been developed to pin the domain walls from moving unless so-directed. Example manners of forming domain wall pinning sites includes provision of notches along the strip that comprises the magnetic material and/or implanting a species in localized spots within the magnetic material of individual strips.

DETAILED DESCRIPTION OF EXAMPLE EMBODIMENTS

Figure 1:
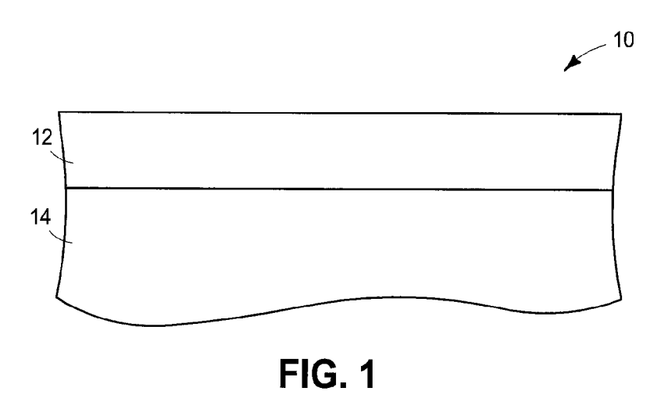
FIG. 1 is a diagrammatic sectional view of a substrate fragment in process in accordance with an embodiment of the invention.

Methods of forming a memory cell in accordance with some embodiments of the invention are initially described with reference to FIGS. 1-4. The memory device will comprise magnetic tracks that individually comprise a plurality of magnetic domains having domain walls. Referring to FIG. 1, an example substrate fragment 10 is shown. Substrate 10 may comprise a semiconductor substrate. In the context of this document, the term "semiconductor substrate" or "semiconductive substrate" is defined to mean any construction comprising semiconductive material, including, but not limited to, bulk semiconductive material such as a semiconductive wafer (either alone or in assemblies comprising other material thereon), and semiconductive material layers (either alone or in assemblies comprising other material). The term "substrate" refers to any supporting structure, including, but not limited to, the semiconductive substrates described above.

Substrate 10 comprises an elevationally outer substrate material 12 which is over an elevationally inner substrate material 14. An example thickness for material 12 is from about 30 nanometers to about 1 micron. Other partially or wholly fabricated components of integrated circuitry may be formed as a part of or be elevationally inward of material 12 (e.g., CMOS devices and at least one level of interconnections), and are not particularly germane to the inventions disclosed herein. Any of the materials and/or structures described herein may be homogenous or non-homogenous, and regardless may be continuous or discontinuous over any material which such overlie. Also when used herein, "different composition" only requires those portions of two stated materials that may be directly against one another to be chemically and/or physically different, for example if such materials are not homogenous. If the two stated materials are not directly against one another, "different composition" only requires that those portions of the two stated materials that are closest to one another be chemically and/or physically different if such materials are not homogenous. In this document, a material or structure is "directly against" another when there is at least some physical touching contact of the stated materials or structures relative one another. In contrast, "over", "on", and "against" not preceded by "directly", encompass "directly against" as well as construction where intervening material(s) or structure(s) result(s) in no physical touching contact of the stated materials or structures relative one another. Further, each material may be formed using any suitable or yet-to-be-developed technique, with atomic layer deposition, chemical vapor deposition, physical vapor deposition, epitaxial growth, diffusion doping, and ion implanting being examples.

In one embodiment, outer substrate material 12 is of uniform composition, although such may not be homogenous. For example, material 12 may possess multiple physical differences. As examples, material 12 may have different amorphous and crystalline regions, crystalline regions of different lattice configurations, monocrystalline regions, polycrystalline regions, etc., yet still maintain uniform chemical composition throughout. Nevertheless, in one embodiment outer substrate material 12 is homogenous. Additionally, material 12 may comprise a mixture of different composition materials that provides a uniform chemical composition throughout. Regardless, in one embodiment the uniform chemical composition of substrate material 12 is dielectric, with at least one of silicon dioxide and silicon nitride being examples.

Figure 2:
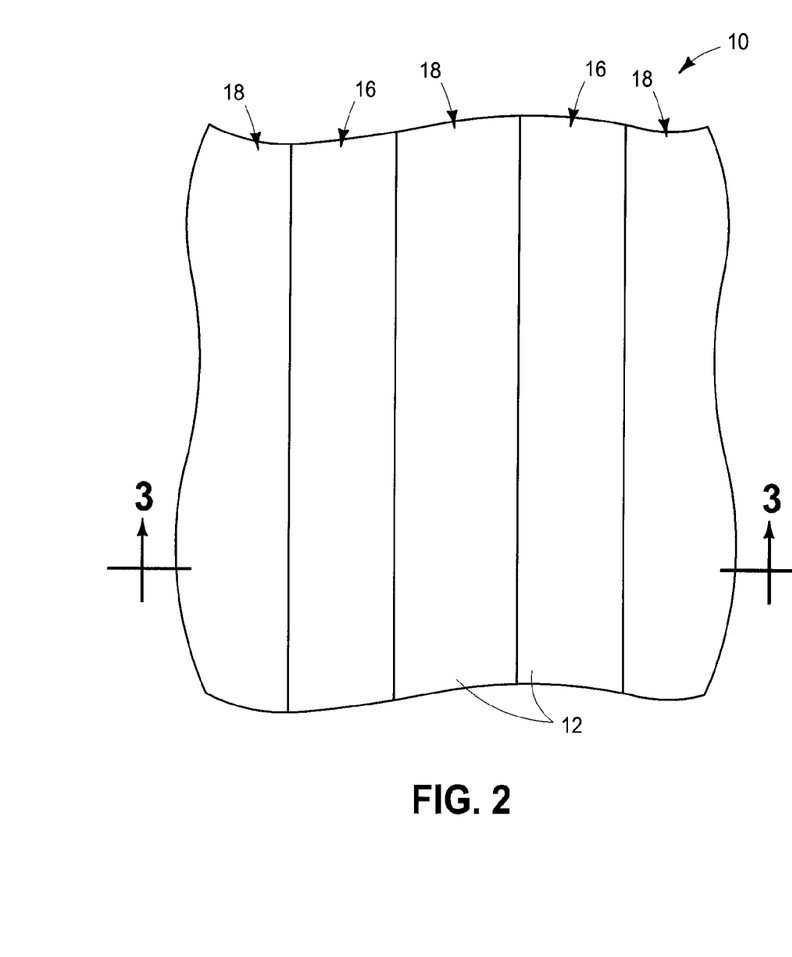
FIG. 2 is a diagrammatic top-plan view of the FIG. 1 substrate at a processing step subsequent to that shown by FIG. 1.
Figure 3:
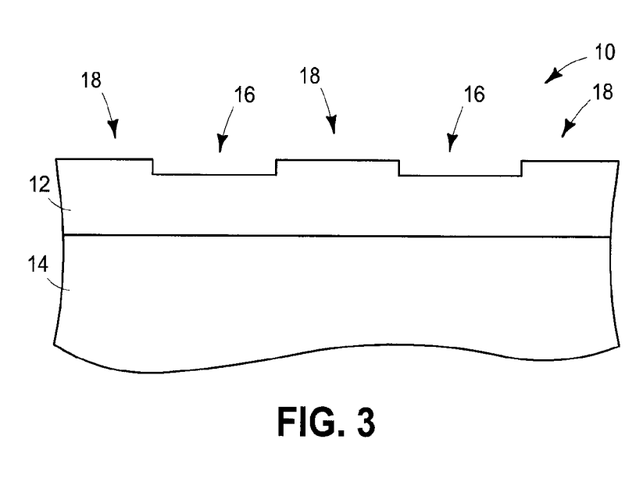
FIG. 3 is view of the FIG. 2 substrate taken through line 3-3 in FIG. 2.

Referring to FIGS. 2 and 3, material 12 has been partially etched into to form alternating regions 16, 18 of elevational depressions and elevational protrusions, respectively, in material 12. Such may be conducted by a timed etch which leaves some of material 12 overlying underlying substrate material 14. In one embodiment and as shown, the alternating regions form elongated parallel trenches and mesas. Regardless, the elevational depressions and elevational protrusions may be formed by any suitable technique, such as lithography (e.g., photolithography) using an etch mask. Further, if lithography is used, the lateral or transverse narrowest dimensions of the respective depressions and protrusions may be sub-lithographic, for example fabricated using pitch multiplication or other technique. In the depicted example, each depression is shown as being of constant minimum width and each protrusion is shown as being of constant minimum width, and those minimum widths are shown being equal relative one another. Alternate configurations could be used, for example with the depressions and/or protrusions having at least two different widths there-along (not shown) and/or different widths relative one another (not shown). Outermost surfaces of depressions 16 and/or protrusions 18 need not be planar. Regardless, an example depth of depression 16 relative to outermost surfaces of protrusions 18 is about 0.5 nanometer to about 0.75 nanometer. In one embodiment, the depths of depressions 16 are from about 25% to about 50% of elevational thickness of the magnetic material of the magnetic tracks (not shown in FIG. 2), with an example magnetic material thickness as-described below being about 1.0 nanometer to about 1.5 nanometers. Depth of depressions 16 need not be constant, although such may be ideal.

Sidewalls of projections 18 are shown as being vertical and orthogonal to planar horizontal outermost surfaces of material 12. In this document, "horizontal" refers to a general direction along a primary surface relative to which the substrate is processed during fabrication, and "vertical" is a direction generally orthogonal thereto. Further as used herein, "vertical" and "horizontal" are generally perpendicular directions relative one another independent of orientation of the substrate in three-dimensional space. Further in this document, "elevational" and "elevationally" are generally with reference to the vertical direction. Alternate angles for the projection sidewalls may be used (e.g., from about 45° to about 135°), and outermost surfaces of material 12 may be other than planar, and if planar may not be coplanar. In the context of this document, "angle" defines some angle other than the straight angle.

Figure 4:
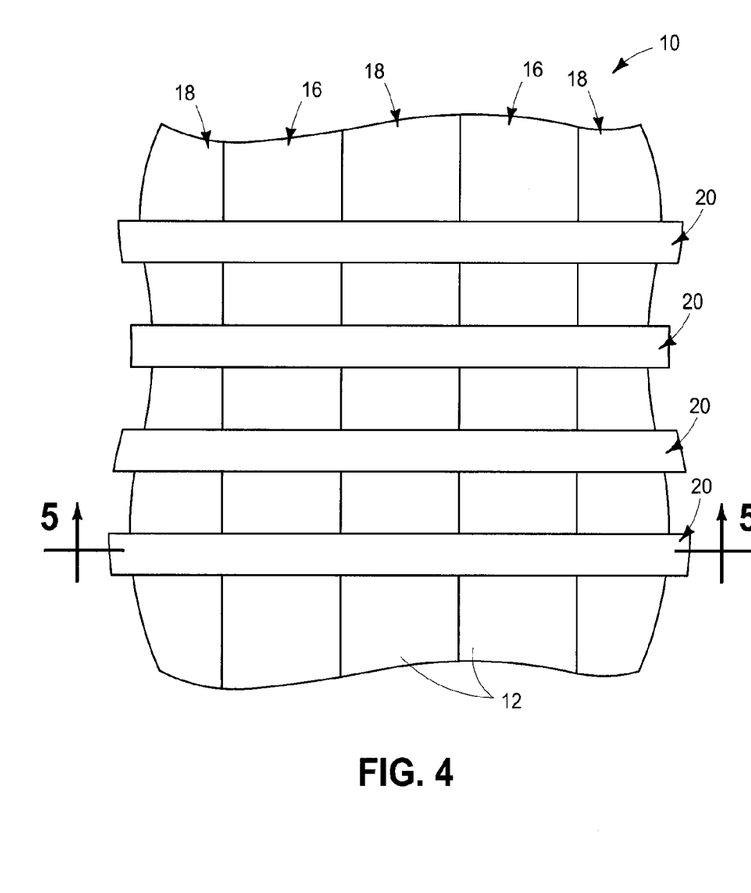
FIG. 4 is a view of the FIG. 2 substrate at a processing step subsequent to that shown by FIG. 2.
Figure 5:
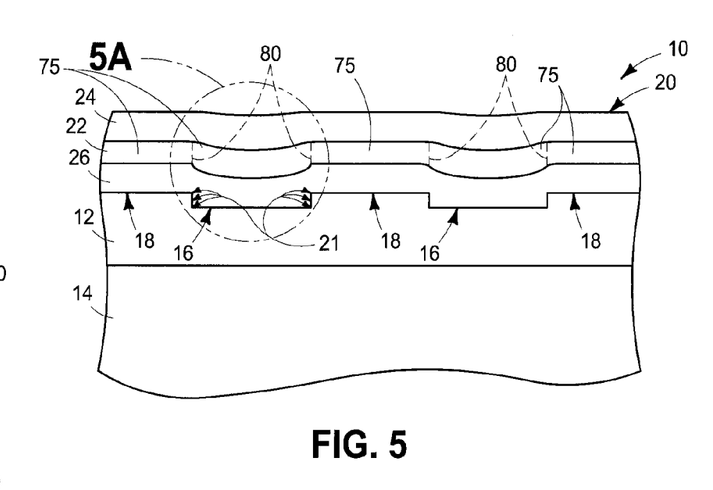
FIG. 5 is view of the FIG. 4 substrate taken through line 5-5 in FIG. 4.
Figure 5A:
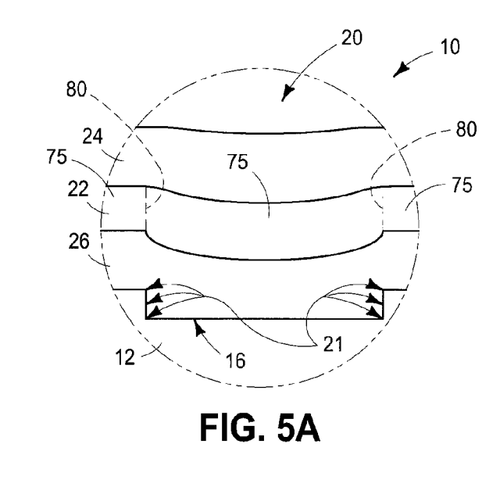
FIG. 5A is an enlarged view of the 5A-circled portion in FIG. 5.

Referring to FIGS. 4, 5, and 5A, a plurality of magnetic tracks 20 has been formed over and angle relative to alternating regions 16 and 18. Orthogonal angling is shown in FIG. 4, although non-orthogonal angling may be used (e.g., from about 45° to some number less than 90°, or from some number greater than 90° to about 135°). Orthogonal or close to orthogonal is ideal. Example magnetic tracks 20 are individually shown as comprising magnetic material 22 received between outer and inner materials 24, 26, respectively. Any alternate existing or yet-to-be-developed constructions and materials may be used. One example magnetic material is CoFeB. Further in one embodiment, one or both of outer material 24 and inner material 26 is electrically conductive. If both are electrically conductive, such may be of the same composition material or of different composition materials. An example thickness for each of materials 24 and 26 is about 5 nanometers and an example thickness for magnetic material 22 is about 1.0 nanometer to about 1.5 nanometers. The thickness of inner material 26 may be adjusted or chosen in proportion to step height and thickness of material 22 to optimize pinning site effectiveness. Magnetic tracks 20 may run parallel relative one another, for example as shown. Such tracks may be straight-linear, curvilinear, include a combination of different straight segments which angle relative one another, and/or a combination of straight and curved segments. Regardless, magnetic material 22 comprises domains 75 and domain walls 80 (FIGS. 5 and 5A).

In one embodiment, the magnetic material of the magnetic tracks is not formed directly against the elevationally outer substrate material, and in one embodiment an electrically conductive material is between the elevationally outer substrate material and the magnetic tracks. FIGS. 4, 5, and 5A show such an example embodiment where magnetic material 22 of tracks 20 is not directly against elevationally outer substrate material 12, with such being spaced therefrom by material 26 (which may be electrically conductive). Regardless, in one embodiment and as shown, magnetic material 22 of the magnetic tracks 20 is not elevationally within depressions 16.

Interfaces of immediately adjacent of regions 16, 18 individually comprise a domain wall pinning site in individual magnetic tracks 20. For example, one or some combination of the outermost edge, the innermost edge, or sidewall of a protrusion relative a depression may be considered as or constitute an interface 21 which functions as a domain wall pinning site 21 in individual magnetic tracks 20.

Figure 6:
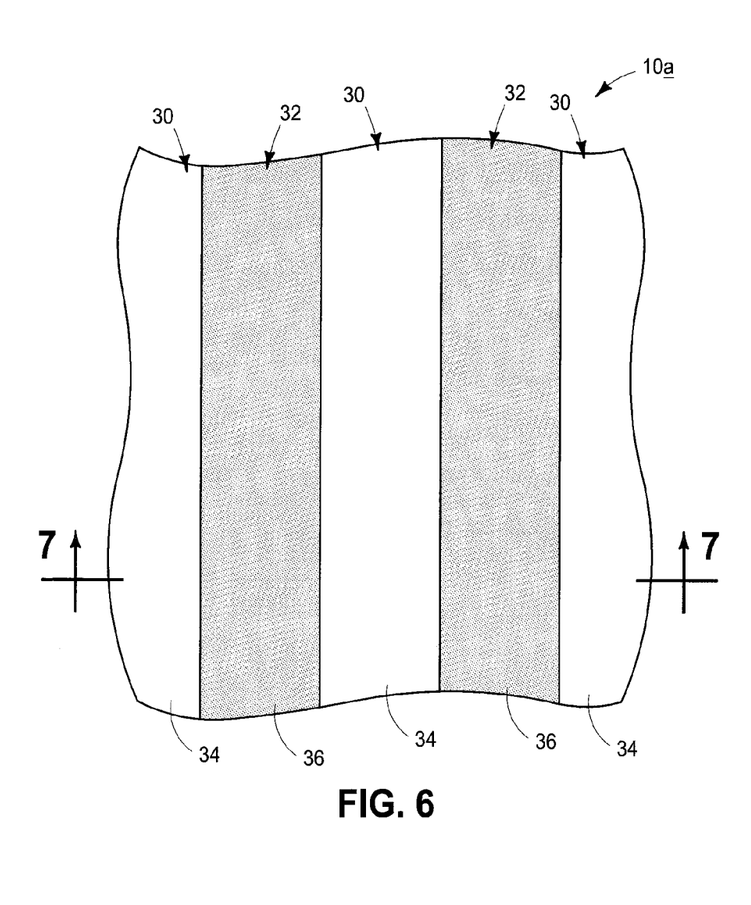
FIG. 6 is a diagrammatic top-plan view of an alternate substrate fragment in process in accordance with an embodiment of the invention.
Figure 7:
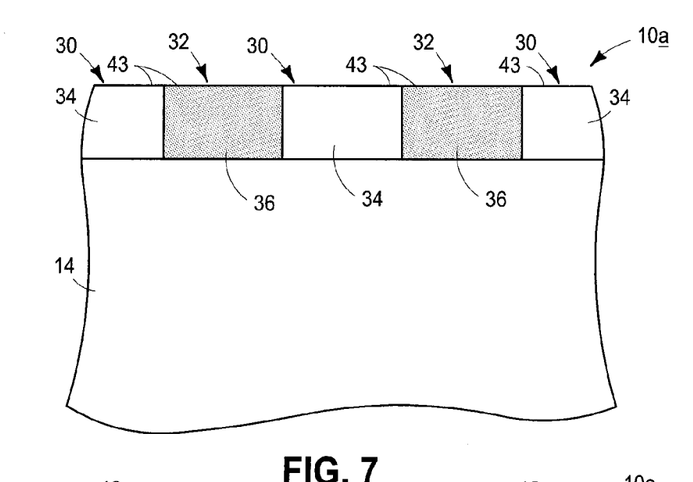
FIG. 7 is view of the FIG. 6 substrate taken through line 7-7 in FIG. 6.

Alternate embodiment methods of forming a memory device are next described with reference to FIGS. 6-15, and 15A. Referring to FIGS. 6 and 7, a substrate fragment 10a is shown. Like numerals from the above-described embodiment have been used where appropriate, with some construction differences being indicated with the suffix "a" or with different numerals. Alternating elevationally outer regions 30, 32 have been formed of two different composition materials 34, 36. The two different compositions may be commonly semiconductive, conductive, and dielectric, or combinations of these. Materials 34 and 36 may be characterized by chemically different compositions, with silicon dioxide and silicon nitride being two examples. Alternately, immediately adjacent regions 30, 32 may be of the same chemical composition and of different physical compositions relative one another, for example different physical compositions as described above. Regardless, in one embodiment, regions 30, 32 have co-planar elevationally outermost surfaces, and regardless in one embodiment have planar elevationally outermost surfaces which are horizontal.

Figure 8:
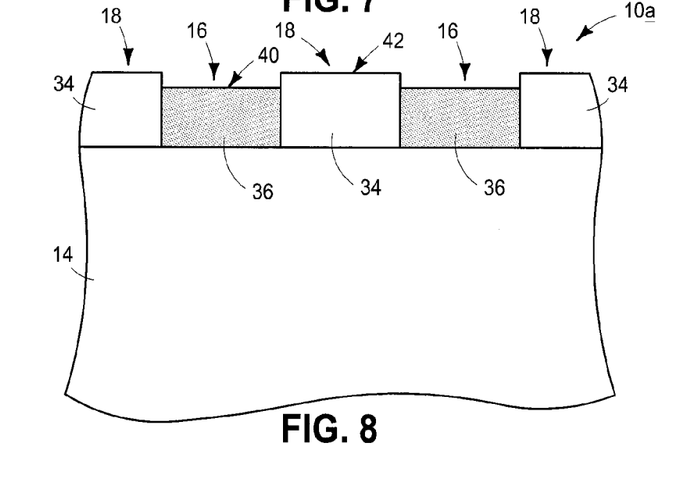
FIG. 8 is a view of the FIG. 7 substrate at a processing step subsequent to that shown by FIG. 7.

One of the two different composition materials is removed inwardly to an elevationally outermost location of the one material that is deeper than an elevationally outermost location of the other of the two different composition materials at the end of the act of removing. Thereby, alternating regions of elevational depressions and elevational protrusions are formed. FIG. 8 shows such an example embodiment wherein material 36 has been removed inwardly to an elevationally outermost location 40 of material 36 that is deeper than an elevationally outermost location 42 of material 34. Thereby, alternating regions of elevational depressions 16 and elevational protrusions 18 have been formed.

The act of removing may remove some of both of the two different composition materials or may remove some of only the one material, for example material 36 as shown in FIG. 8. Regardless, in one embodiment, the removing comprises polishing, for example mechanical polishing or chemical mechanical polishing. In one embodiment, the polishing removes some of both of the two different composition materials, with the one material (e.g., material 36 as shown) being over-polished relative the other material (e.g., material 34). In one embodiment, the act of removing comprises chemical etching in the absence of any mechanical polishing component. Any chemical etching may etch the other of the two different composition materials (e.g., material 34 as well as material 36), or may not measurably etch the other of the two different composition materials. Use of two different composition materials with different sensitivity to chemical mechanical polishing may allow a controlled small degree of over-polish which enables small steps to be created where desired.

Figure 9:
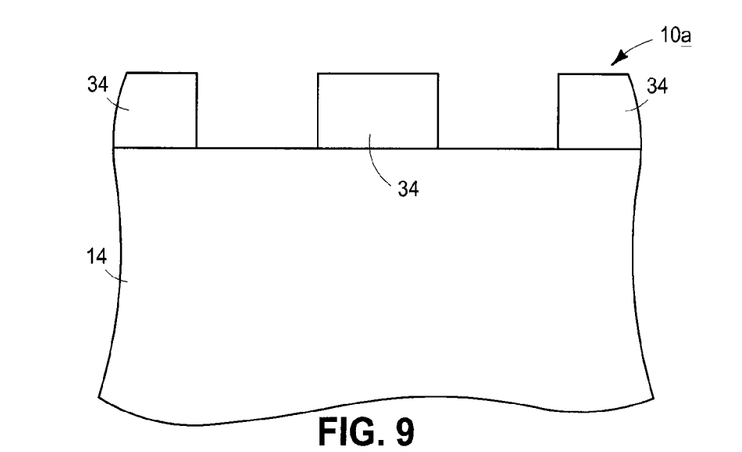
FIG. 9 is a view of a predecessor substrate to that of FIG. 7.

Any existing or yet-to-be-developed techniques may be used for producing a FIGS. 6 and 7-like construction. For example, material 34 may be considered as a first composition and material 36 as a second composition. The alternating regions 30, 32 of FIGS. 6 and 7 may be formed by depositing one of the first composition or the second composition over underlying substrate material (e.g., material 14). Then, etching is conducted through such one of the first or second compositions to the underlying substrate material. By way of example, FIG. 9 shows first composition material 34 having been deposited over underlying substrate material 14, with material 34 having been subsequently etched-through to underlying substrate 14 to produce the depicted pattern. Again, lithographic or other technique could be used, including pitch multiplication techniques. Then, other material 36 could be formed over underlying substrate 14 and between material 34. Such may also be formed elevationally over material 34. Processing then may be conducted as described above to produce the construction of FIGS. 6 and 7, and/or FIG. 8.

Figure 10:
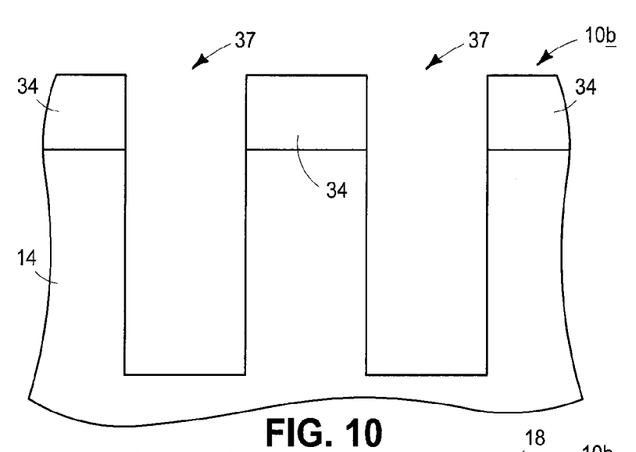
FIG. 10 is a view of an alternate predecessor substrate to the FIG. 9.
Figure 11:
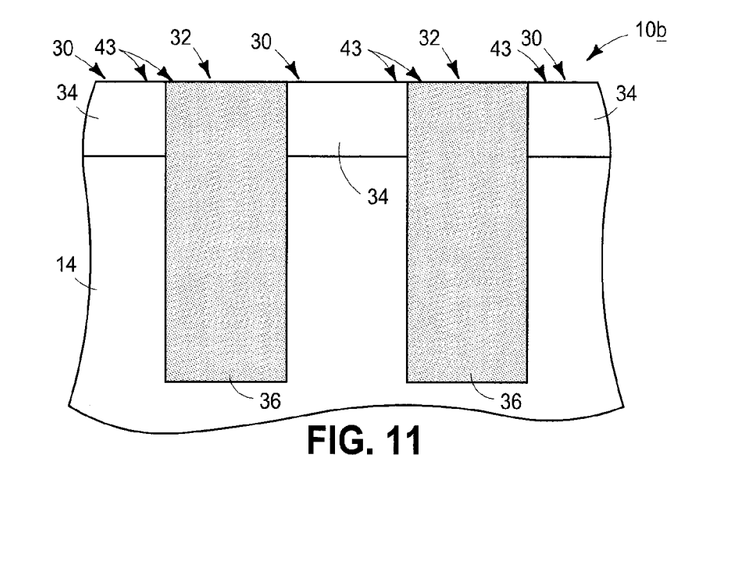
FIG. 11 is a view of the FIG. 10 substrate at a processing step subsequent to that shown by FIG. 10.
Figure 12:
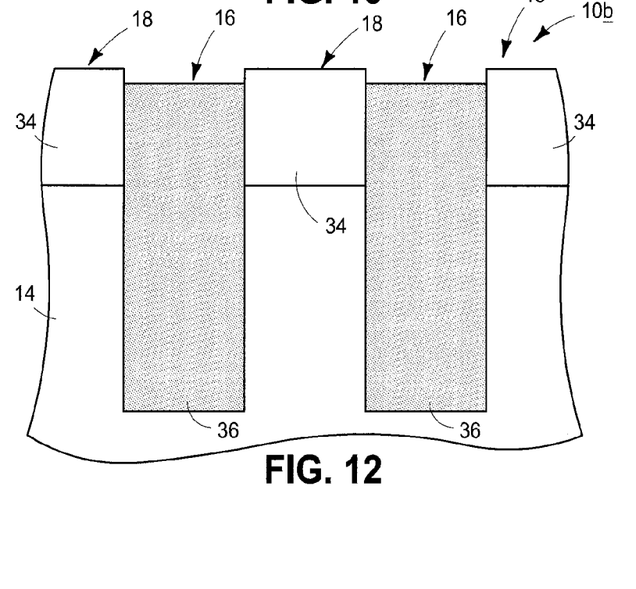
FIG. 12 is a view of the FIG. 11 substrate at a processing step subsequent to that shown by FIG. 11.
Figure 13:
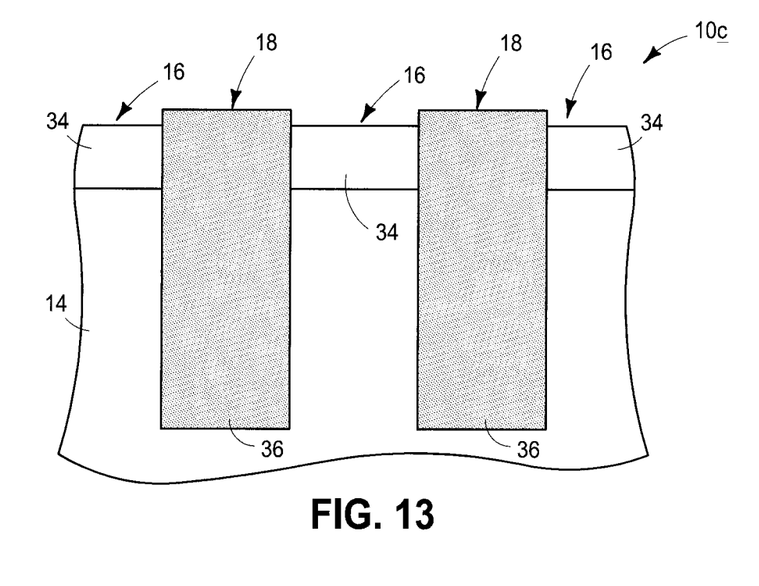
FIG. 13 is a view of an alternate substrate at an alternate processing step subsequent to that shown by FIG. 11.

An alternate technique for forming alternating regions 30, 32 is next described with reference to FIGS. 10-12 with respect to a substrate fragment 10b. Like numerals from the above-described embodiments have been used where appropriate, with some construction differences being indicated with the suffix "b" or with different numerals. FIG. 10 shows example alternate or additional processing to that depicted by FIG. 9. Referring to FIG. 10, one of the first composition or the second composition (e.g., material 34) has been deposited over underlying substrate material 14. Etching has then been conducted through the one of the first or second compositions into the underlying material to form trenches 37 in underlying material 14 and the one of the first and second compositions (e.g., material 34). The trenches are then over-filled with the other of the first and second compositions. At least some of the over-filled material is then removed, for example to produce the construction of FIG. 11. The one or the other of the first and second compositions may then be removed inwardly, for example as shown alternatively with respect to substrate fragment 10b in FIG. 12 and a substrate fragment 10c in FIG. 13.

Figure 14:
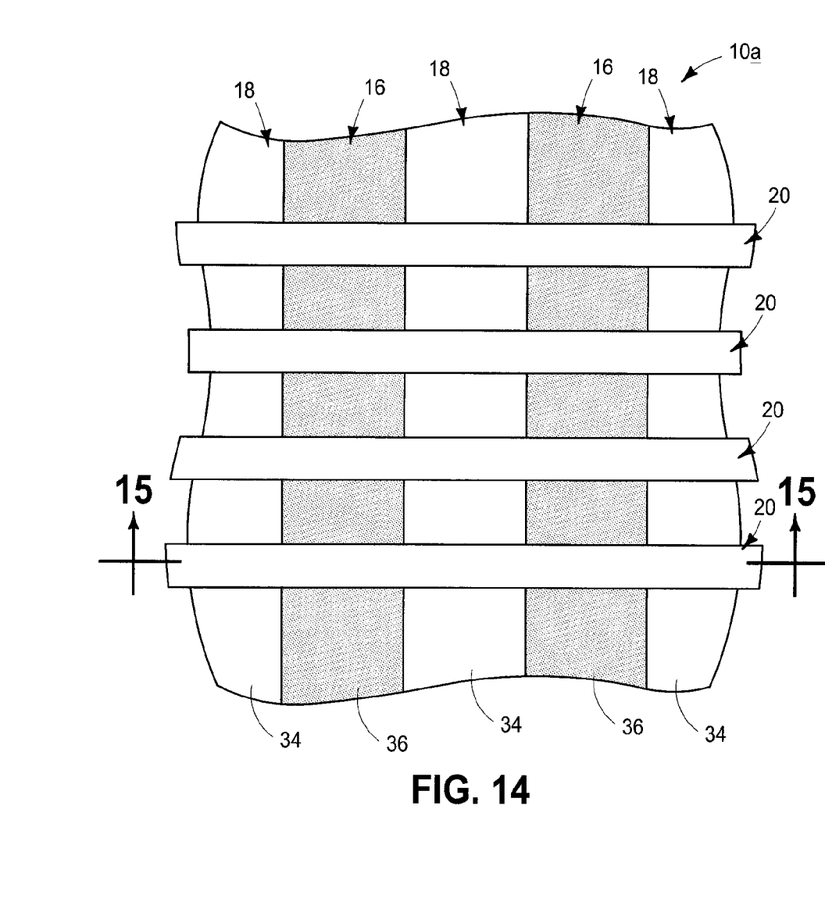
FIG. 14 is a view of the FIG. 8 substrate at a processing step subsequent to that shown by FIG. 8.
Figure 15:
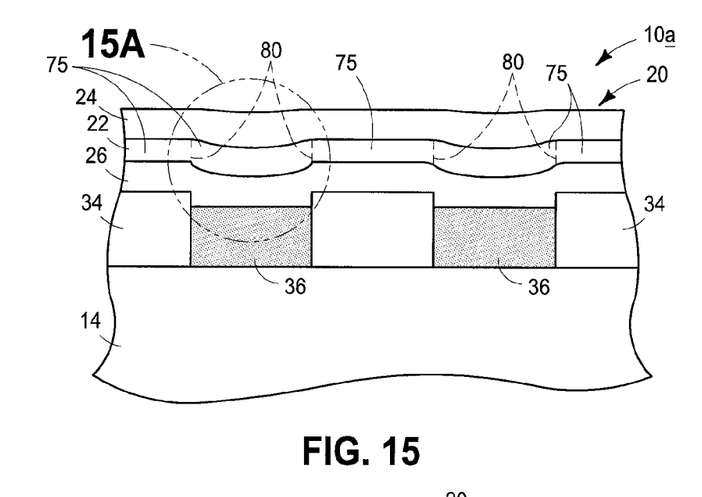
FIG. 15 is view of the FIG. 14 substrate taken through line 15-15 in FIG. 14.
Figure 15A:
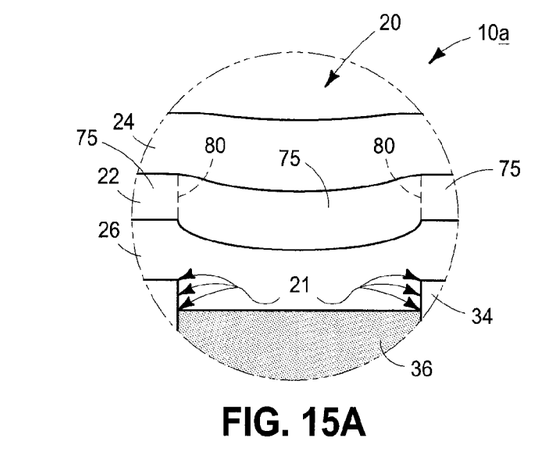
FIG. 15A is an enlarged view of the 15A-circled portion in FIG. 15.

Referring to FIGS. 14, 15, and 15A with respect to substrate 10a, a plurality of magnetic tracks 20 has been formed over and angle relative to alternating regions 16, 18. Interfaces 21 (two being shown in FIG. 15A) of immediately adjacent of regions 16, 18 individually comprise a domain wall pinning site 21 in individual magnetic tracks 20.

Additional example methods of forming a memory device are next described with reference to FIGS. 7, 11, 16, and 16A. In such embodiments, a series of regions are formed which have coplanar outer surfaces, with immediately adjacent of the regions being of different composition relative one another. For example, the embodiments of FIGS. 7 and 11 may be considered as showing a series of regions 30, 32 having coplanar outer surfaces 43 where immediately adjacent of such regions are of different compositions 34, 36 relative one another. Any one or more of the attributes as described above may be used. In one embodiment, the series of regions is characterized by alternating first and second chemically different composition regions in the series. In one embodiment, the series of regions is characterized by only two different compositions having coplanar outer surfaces 43. Regardless, in one embodiment, the coplanar outer surfaces are formed to be horizontal, in one embodiment are formed to be horizontal or within 10° of horizontal, and in one embodiment are formed to be elevationally extending (i.e., having some degree of elevational extent such that the coplanar surfaces are not perfectly horizontal) (not shown).

Figure 16:
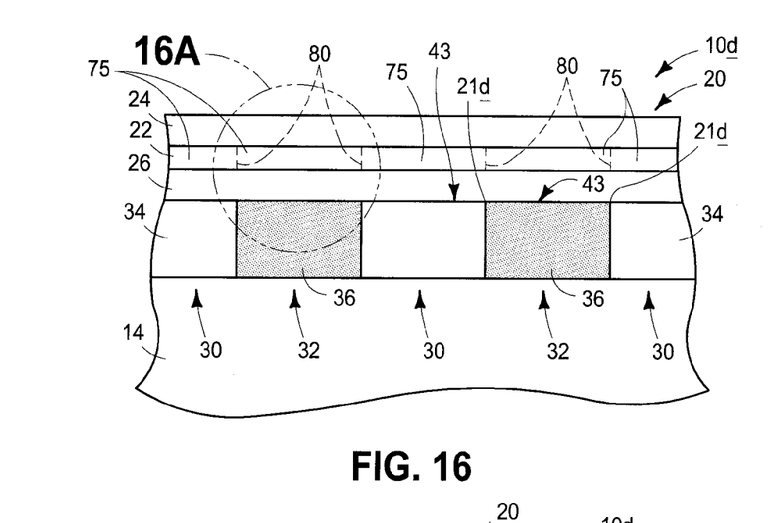
FIG. 16 is a diagrammatic sectional view of an alternate substrate fragment in process in accordance with an embodiment of the invention.
Figure 16A:
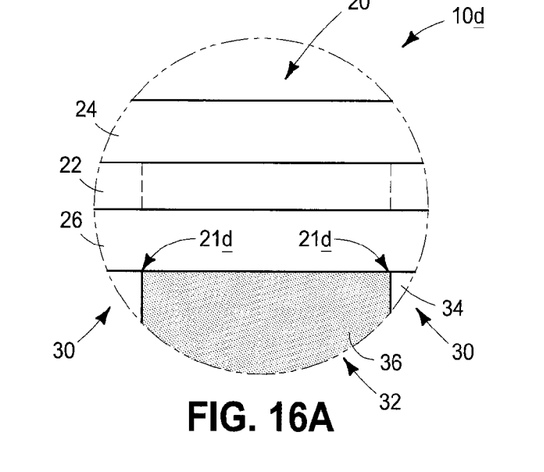
FIG. 16A is an enlarged view of the 16A-circled portion in FIG. 16.

Referring to FIGS. 16 and 16A, a plurality of magnetic tracks 20 has been formed over coplanar outer surfaces 43 and which angle relative to different composition regions 30, 32. The substrate of FIGS. 16 and 16A is indicated with reference numeral 16d, with like numerals from the above-described embodiments having been used where appropriate, with some construction differences being indicated with the suffix "d". Interfaces 21d of immediately adjacent regions 30, 32 individually comprise a domain wall pinning site 21d in individual magnetic tracks 20. Accordingly, in some embodiments, a pinning site is realized (without any elevational step between regions) by mere composition differences in the two materials over which the magnetic track lies, where for example the different composition is at least one of physical or chemical. Such may result from mechanical stress provided by the two different composition materials or by other phenomena.

Figure 17:
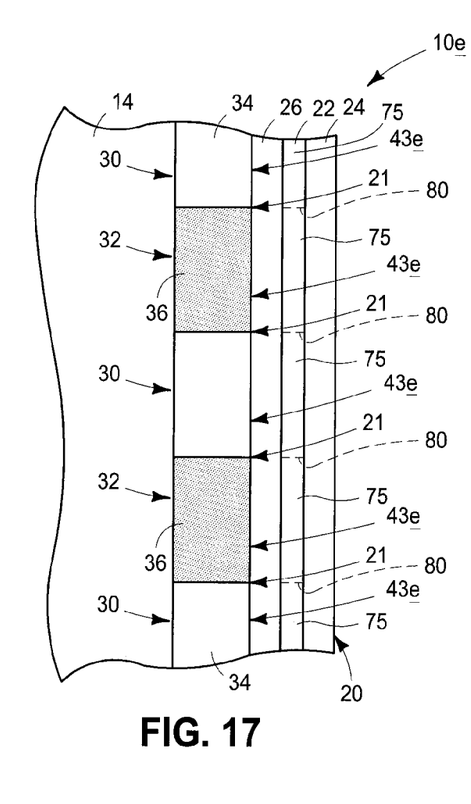
FIG. 17 is a diagrammatic sectional view of an alternate substrate fragment in accordance with an embodiment of the invention.

The above-described processing leading to FIGS. 16 and 16A is with respect to an embodiment wherein coplanar outer surfaces 43 are shown to be horizontal. Embodiments of the invention also contemplate methods (and structure as described below) wherein the coplanar outer surfaces are not horizontal, for example as shown with respect to a substrate fragment 10e as shown in FIG. 17. Like numerals from the above-described embodiments have been used where appropriate, with some construction differences being indicated with the suffix "e". Substrate 10e is shown with materials 34, 36 having a co-planar vertical surface 43e. An alternate co-planar surface (not shown) may be neither horizontal nor vertical. Regardless, any of the attributes described above with the stated materials and constructions may be used in the embodiment of FIG. 17.

Embodiments of the invention encompass memory devices independent of method of manufacture. In one such embodiment, a memory device comprises magnetic tracks which individually comprise a plurality of magnetic domains having domain walls. The memory device comprises a series of regions having coplanar outer surfaces, with immediately adjacent of the regions being of different composition relative one another. The embodiments of FIGS. 16, 16A, and FIG. 17 show example such embodiments with respect to series of regions 30, 32 having coplanar outer surfaces 43, 43e, respectively. (FIG. 23 also shows such an embodiment, and is described in more detail below). A plurality of magnetic tracks (e.g., tracks 20) is formed over the coplanar outer surfaces of and which angle relative to the different composition regions. Interfaces of immediately adjacent of the regions (e.g., interfaces 21d, 21) individually comprise a domain wall pinning site in individual of the magnetic tracks. Any of the other structural and compositional aspects as described above in the method embodiments may be employed in the memory device embodiment.

Appropriate circuitry and devices (not shown) may be used to move the magnetic domains and domain walls to/past read and/or write heads (not shown), and are not germane to the inventions disclosed herein. Further, the magnetic tracks may be include segments or portions that are oriented horizontally, vertically, otherwise, and/or combinations thereof.

Figure 18:
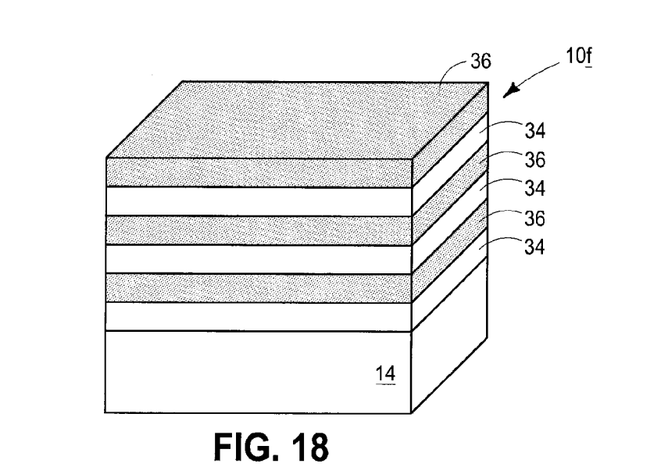
FIG. 18 is a diagrammatic oblique view of an alternate substrate fragment in process in accordance with an embodiment of the invention.

Additional example methods of forming a memory device are next described initially with reference to FIGS. 18-22 with respect to a substrate fragment 10f. Like numerals from the above-described embodiments have been used where appropriate, with some construction differences being indicated with the suffix "f" or with different numerals. Referring to FIG. 18, a series of elevationally stacked regions 34, 36 has been formed over substrate 14. Immediately adjacent of regions 34, 36 are of different composition relative one another.

Figure 19:
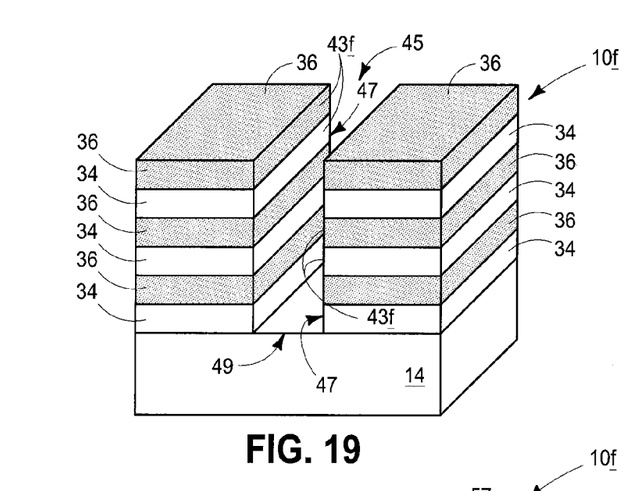
FIG. 19 is a view of the FIG. 18 substrate at a processing step subsequent to that shown by FIG. 18.

Referring to FIG. 19, longitudinally elongated first trenches 45 (only one being shown for brevity in the figures) have been formed through at least some of regions 34, 36 (e.g., all of such regions as shown). Individual first trenches 45 may be oriented longitudinally parallel relative on another. Additionally, the trenches may be longitudinally straight linear, longitudinally curvilinear, include a combination of longitudinally straight and curved segments, and/or include individual longitudinal segments that angle relative one another. First trenches 45 individually comprise opposing sidewalls 47 and a base 49. In one embodiment and as shown, the forming of the first trenches forms lateral surfaces 43f of stacked regions 34, 36 elevationally along individual sidewalls of individual first trenches to be individually planar.

Figure 20:
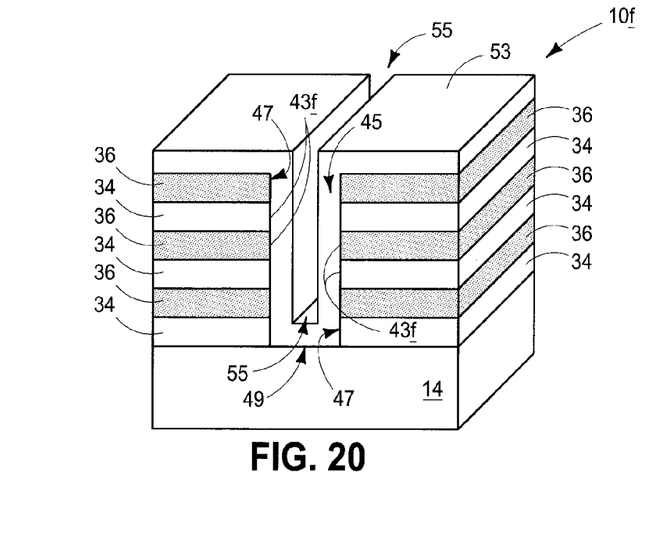
FIG. 20 is a view of the FIG. 19 substrate at a processing step subsequent to that shown by FIG. 19.
Figure 21:
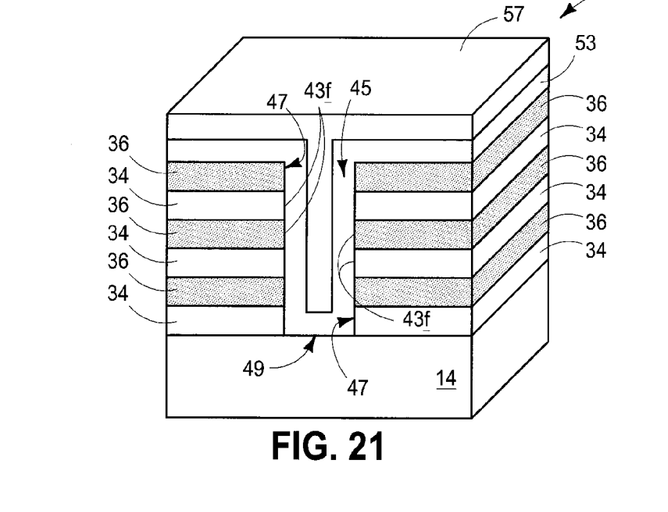
FIG. 21 is a view of the FIG. 20 substrate at a processing step subsequent to that shown by FIG. 20.

Referring to FIG. 20, magnetic track material 53 has been formed within individual first trenches 45 against opposing first trench sidewalls 47 and first trench base 49. Magnetic track material 53 may be formed directly against sidewalls 47 and base 49, as shown. Magnetic track material 53 may entirely comprise magnetic material (e.g., CoFeB) or comprise a composite of different materials some of which may not be magnetic (e.g., a composite of materials 22, 24, 26 as described above and further below). Regardless, FIG. 20 shows one example embodiment wherein magnetic track material 53 is formed to line and less-than-fill individual first trenches 45 and form a cavity 55 within individual first trenches 45. Further, in one such embodiment and referring to FIG. 21, cavities 55 have been filled with dielectric 57 (e.g., silicon dioxide and/or silicon nitride).

Figure 22:
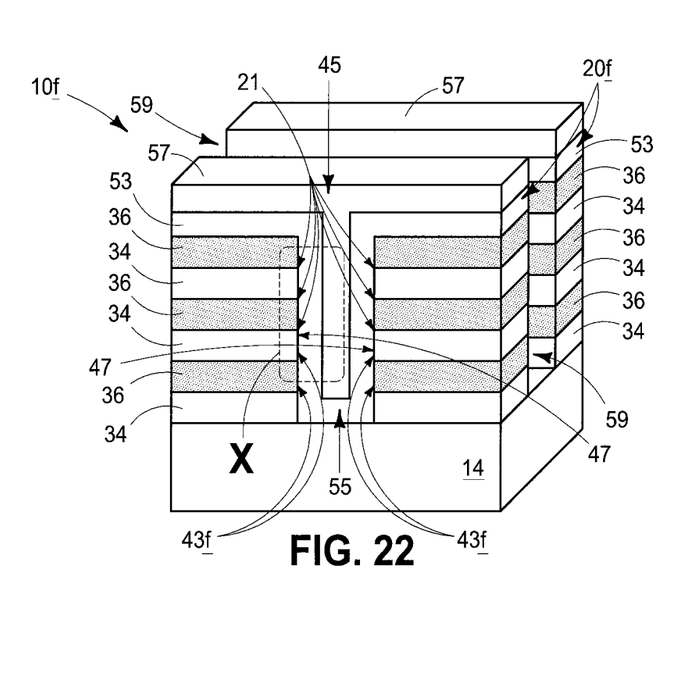
FIG. 22 is a view of the FIG. 21 substrate at a processing step subsequent to that shown by FIG. 21.
Figure 23:
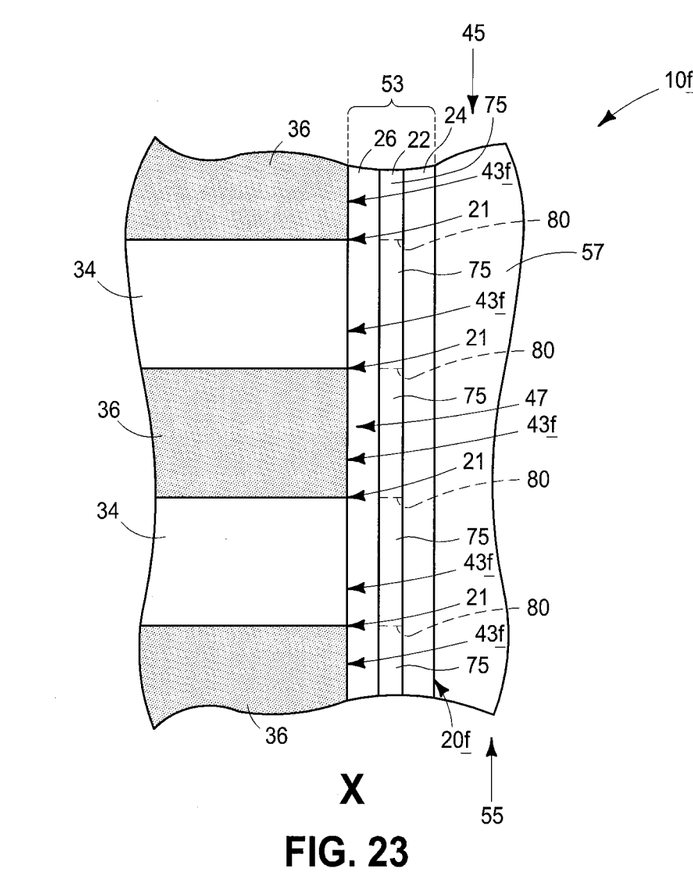
FIG. 23 is an enlarged side-elevational view of a portion of the FIG. 22 substrate.
Figure 24:
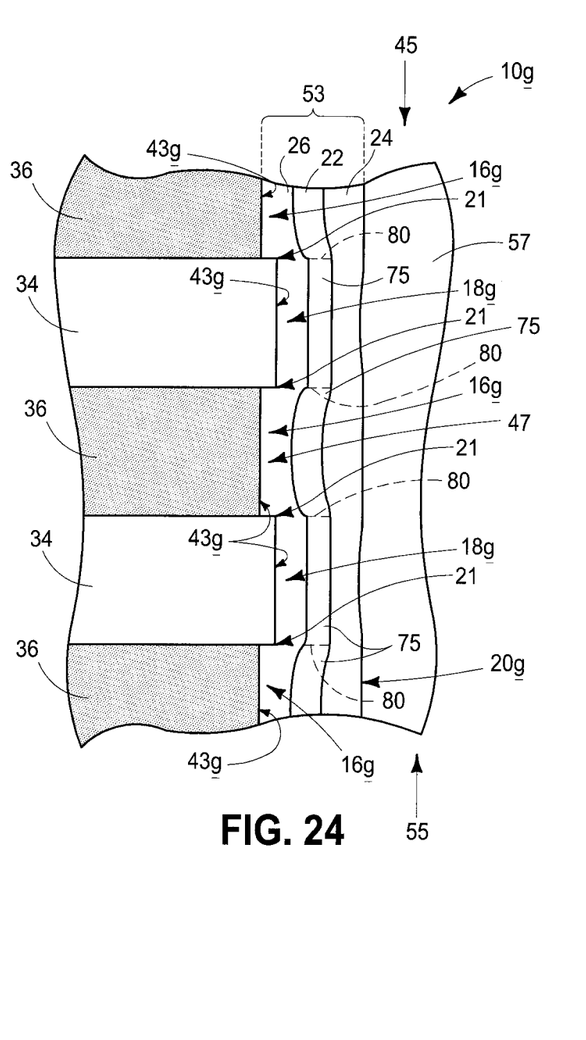
FIG. 24 is a view of an alternate embodiment substrate to that shown by FIG. 23.

Referring to FIG. 22, longitudinally elongated second trenches 59 (only one being shown for brevity in the figures) have been formed elevationally through magnetic track material 53 and at least some of elevationally stacked regions 34, 36 (e.g., all as shown) to form magnetic tracks 20f which individually comprise a plurality of magnetic domains having domain walls (e.g., magnetic domains 75 having domain walls 80 as shown in FIGS. 23 and 24). Dielectric material 57 may not be formed prior to forming second trenches 59 (not shown). Yet if formed, second trenches 59 will be formed elevationally into dielectric material 57, and in one embodiment elevationally through dielectric material 57 as shown. In one embodiment and as shown, second trenches 59 are formed through the same regions 34, 36 into which first trenches 45 were formed, and in one embodiment through all of regions 34, 36 as shown. Regardless, second trenches 59 longitudinally angle relative to first trenches 45. Orthogonal angling is shown in FIG. 22, although non-orthogonal angling may be used (e.g., from about 45° to some number less than 90°, or from some number greater than 90° to about 135°). Orthogonal or close to orthogonal is ideal. Regardless, interfaces 21 of immediately adjacent of regions 34, 36 along an individual sidewall 47 individually comprise a domain wall pinning site 21 in magnetic track 20f along that sidewall 47. Second trenches 59 may ultimately be filled with dielectric and/or other material (not shown).

In one embodiment where lateral surfaces 43f of stacked regions 34, 36 elevationally along individual sidewalls 47 are individually planar, such may be formed to be coplanar, for example as shown in FIG. 23. The enlarged view of FIG. 23 is of region X in FIG. 22, and shows magnetic track material 53 as comprising a composite of materials 22, 24, and 26. Regardless, in one embodiment and as shown, coplanar lateral surfaces 43f are formed to be vertical. Alternately, the lateral surfaces may be formed to be non-vertical (not shown), for example within 10 degrees of vertical or within 45 degrees of vertical.

As an alternate example, the first trenches may be formed such that stacked regions 34, 36 elevationally along individual sidewalls of individual first trenches comprise elevationally alternating regions of lateral sidewall depressions and lateral sidewall protrusions. FIG. 24 shows such an example alternate embodiment substrate 10g having lateral sidewall depressions 16g and lateral sidewall protrusions 18g. Like numerals from the above-described embodiments have been used where appropriate, with some construction differences being indicated with the suffix "g". FIG. 24, like FIG. 23, is an enlarged view of a region X in FIG. 22. Example attributes and depths of depressions 16g relative to outermost surfaces of protrusions 18g may be as described above with respect to depressions 16 and protrusions 18. Further, in one embodiment and as shown, magnetic material 22 of magnetic tracks 20g may not be laterally within lateral sidewall depressions 16g. Trenches 45 and 59 may be formed by any existing or yet-to-be-developed manner(s), for example using photolithographic patterning and etch. Further, an etching chemistry or chemistries used to etch first trenches 45 may etch one of materials 34, 36 (e.g., material 36 as shown in FIG. 24) at a greater rate than any etch of the other to produce the depicted depressions 16g and protrusions 18g.

As with the above-described embodiments, appropriate circuitry and devices (not shown) may be used to move the magnetic domains and the domain walls to/past read and/or write heads (not shown) and are not germane to the inventions disclosed herein. By ways of example only, read and/or write elements could be placed one or both of below and/or as a part of trench base 49, and/or atop magnetic tracks 20f, 20g elevationally over regions 34, 36.

FIGS. 22 and 23, and FIG. 24, show two example additional embodiments of the invention to that of FIG. 17 which may encompass a memory device independent of manufacture. For example, embodiments of the invention encompass a memory device (e.g., FIG. 17; FIGS. 22, 23; and FIG. 24) wherein a series of elevationally stacked regions (e.g., 34, 36) have openings (e.g., openings 45) extending elevationally through at least some of the stacked regions. Immediately adjacent of those regions are of different composition relative one another. The openings individually comprise opposing sidewalls (e.g., sidewalls 47) and a base (e.g., base 49). A magnetic track (e.g., track 20, 20f, 20g) is within individual of the openings against the opposing opening sidewalls and the opening base. Interfaces of immediately adjacent of the regions (e.g., interfaces 21) along an individual sidewall individually comprise a domain wall pinning site (e.g., pinning sites 21) in the magnetic track along that sidewall.

In some embodiments, lateral surfaces of the stacked regions elevationally along individual sidewalls of individual openings are individually planar (e.g., lateral surfaces 43e, 43f, and 43g). In one such embodiment, the lateral surfaces may be coplanar and in one embodiment may be vertical or within 10° of vertical (e.g., FIGS. 17 and 23). In one embodiment, the stacked regions elevationally along individual sidewalls of individual openings form elevationally alternating regions of lateral sidewall depressions and lateral sidewall protrusions (e.g., FIG. 24).

In some embodiments, the magnetic track within individual openings lines and less-than-fills the individual openings and forms a cavity within the individual openings (e.g., cavity 55). In one embodiment, solid dielectric material fills the cavity (e.g., material 57).

Any other attribute as described above with respect to method associated with FIGS. 18-24 may be used in the device embodiments as shown in FIGS. 22-24. Further, any of the attributes described above in connection with the embodiments of FIGS. 1-17 may be used in the method and/or device embodiments of FIGS. 18-24.

CONCLUSION

In some embodiments, a method of forming a memory device comprising magnetic tracks individually comprising a plurality of magnetic domains having domain walls comprises forming an elevationally outer substrate material of uniform chemical composition. The uniform composition material is partially etched into to form alternating regions of elevational depressions and elevational protrusions in the uniform composition material. A plurality of magnetic tracks is formed over and which angle relative to the alternating regions. Interfaces of immediately adjacent of the regions individually comprise a domain wall pinning site in individual of the magnetic tracks.

In some embodiments, a method of forming a memory device comprising magnetic tracks individually comprising a plurality of magnetic domains having domain walls comprises forming alternating elevationally outer regions of two different composition materials. One of the two different composition materials is removed inwardly to an elevationally outermost location of the one material that is deeper than an elevationally outermost location of the other of the two different composition materials at the end of said removing to form alternating regions of elevational depressions and elevational protrusions. A plurality of magnetic tracks is formed over and which angle relative to the alternating regions. Interfaces of immediately adjacent of the regions individually comprise a domain wall pinning site in individual of the magnetic tracks.

In some embodiments, a method of forming a memory device comprising magnetic tracks individually comprising a plurality of magnetic domains having domain walls comprises forming a series of regions having coplanar outer surfaces. Immediately adjacent of the regions are of different composition relative one another. A plurality of magnetic tracks is over the coplanar outer surfaces of and which angle relative to the different composition regions. Interfaces of immediately adjacent of the regions individually comprise a domain wall pinning site in individual of the magnetic tracks.

In some embodiments, a memory device comprising magnetic tracks individually comprising a plurality of magnetic domains having domain walls, comprises a series of regions having coplanar outer surfaces. Immediately adjacent of the regions are of different composition relative one another. A plurality of magnetic tracks is over the coplanar outer surfaces of and which angle relative to the different composition regions. Interfaces of immediately adjacent of the regions individually comprise a domain wall pinning site in individual of the magnetic tracks.

In some embodiments, a method of forming a memory device comprising magnetic tracks individually comprising a plurality of magnetic domains having domain walls comprises forming an elevationally outer substrate material elevationally over underlying material. The elevationally outer substrate material is etched through, with the etching continuing into the underlying material to form trenches in the underlying material and the outer substrate material. The trenches are over-filled with material of different composition from that of the outer substrate material. The material of different composition is removed to expose the outer substrate material. One of the material of different composition or the outer substrate material is removed inwardly to form alternating regions of elevational depressions and elevational protrusions. A plurality of magnetic tracks is formed over and which angle relative to the alternating regions. Interfaces of immediately adjacent of the regions individually comprising a domain wall pinning site in individual of the magnetic tracks.

In some embodiments, a method of forming a memory device comprising magnetic tracks individually comprising a plurality of magnetic domains having domain walls comprises forming a series of elevationally stacked regions. Immediately adjacent of the regions are of different composition relative one another. Longitudinally elongated first trenches are formed elevationally through at least some of the regions. The first trenches individually comprise opposing sidewalls and a base. Magnetic track material is formed within individual of the first trenches against the opposing first trench sidewalls and the first trench base. Longitudinally elongated second trenches are formed elevationally through the magnetic track material and at least some of the regions to form magnetic tracks which individually comprise a plurality of magnetic domains having domain walls. The second trenches longitudinally angle relative to the first trenches. Interfaces of immediately adjacent of the regions along an individual sidewall individually comprise a domain wall pinning site in the magnetic track along that sidewall.

In some embodiments, a memory device comprising magnetic tracks individually comprising a plurality of magnetic domains having domain walls comprises a series of elevationally stacked regions having openings extending elevationally through at least some of the regions. Immediately adjacent of the regions are of different composition relative one another. The openings individually comprise opposing sidewalls and a base. A magnetic track is within individual of the openings against the opposing opening sidewalls and the opening base. Interfaces of immediately adjacent of the regions along an individual sidewall individually comprise a domain wall pinning site in the magnetic track along that sidewall.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming a memory device comprising magnetic tracks individually comprising a plurality of magnetic domains having domain walls, comprising:
    forming alternating elevationally outer regions of two different composition materials;
    removing one of the two different composition materials inwardly to an elevationally outermost location of the one material that is deeper than an elevationally outermost location of the other of the two different composition materials at the end of said removing to form alternating regions of elevational depressions and elevational protrusions; and
    forming a plurality of magnetic tracks over and which angle relative to the alternating regions, interfaces of immediately adjacent of the regions individually comprising a domain wall pinning site in individual of the magnetic tracks.

2. The method of claim 1 wherein the removing removes some of both of the two different composition materials.

3. The method of claim 1 wherein the removing comprises polishing.

4. The method of claim 3 wherein the removing comprises chemical mechanical polishing.

5. The method of claim 3 wherein the polishing removes some of both of the two different composition materials, the one being over-polished relative the other.

6. The method of claim 1 wherein the removing comprises chemical etching in the absence of any mechanical polishing component.

7. The method of claim 6 wherein the chemical etching does not measurably etch the other of the two different composition materials.

8. The method of claim 6 wherein the chemical etching also etches the other of the two different composition materials.

9. The method of claim 1 wherein the two materials may be characterized by chemically different compositions.

10. The method of claim 9 wherein the two chemically different compositions respectively comprise silicon dioxide and silicon nitride.

11. The method of claim 9 wherein the one is a first composition and the other is a second composition, the forming of the alternating regions comprises:
    depositing one of the first composition or the second composition over underlying substrate material;
    etching through said one of the first or second compositions to the underlying substrate material; and
    forming said other of the first or second compositions over the underlying substrate material between said one of the first or second compositions.

12. The method of claim 9 wherein the one is a first composition and the other is a second composition, the forming of the alternating regions comprises:
    depositing one of the first composition or the second composition over underlying substrate material;
    etching through said one of the first or second compositions into the underlying material to form trenches in the underlying material and said one of the first and second compositions; and
    over-filling the trenches with the other of the first and second compositions.

13. The method of claim 1 wherein immediately adjacent of the regions are of the same chemical composition and of different physical compositions relative one another.

14. A method of forming a memory device comprising magnetic tracks individually comprising a plurality of magnetic domains having domain walls, comprising:
    forming an elevationally outer substrate material elevationally over underlying material;
    etching through the elevationally outer substrate material into the underlying material to form trenches in the underlying material and the outer substrate material;
    over-filling the trenches with material of different composition from that of the outer substrate material;
    removing the material of different composition to expose the outer substrate material;

removing one of the material of different composition or the outer substrate material inwardly to form alternating regions of elevational depressions and elevational protrusions; and forming a plurality of magnetic tracks over and which angle relative to the alternating regions, interfaces of immediately adjacent of the regions individually comprising a domain wall pinning site in individual of the magnetic tracks.

15. The method of claim 14 wherein the removing to form the alternating regions is of the material of different composition.

16. The method of claim 14 wherein the removing to form the alternating regions is of the outer substrate material.

* * * * *